(12) United States Patent
Rhee et al.

(10) Patent No.: US 9,941,855 B1
(45) Date of Patent: Apr. 10, 2018

(54) MOTOR VEHICLE SOUND ENHANCEMENT

(71) Applicant: Bose Corporation, Framingham, MA (US)

(72) Inventors: Samuel Sangmin Rhee, Northborough, MA (US); Takashi Kinoshita, Kanagawa-ken (JP)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/420,136

(22) Filed: Jan. 31, 2017

(51) Int. Cl.
  *H03G 5/16* (2006.01)
  *H04R 3/12* (2006.01)
  *G10L 25/54* (2013.01)

(52) U.S. Cl.
  CPC ............. *H03G 5/165* (2013.01); *G10L 25/54* (2013.01); *H04R 3/12* (2013.01); *H04R 2499/13* (2013.01)

(58) Field of Classification Search
  CPC ...... H03G 5/165; H04R 3/12; H04R 2499/13; G10L 25/54
  See application file for complete search history.

(56) References Cited

U.S. PATENT DOCUMENTS

| | | | | |
|---|---|---|---|---|
| 4,701,750 A * | 10/1987 | Wilkinson | ................. | B62J 3/00 340/384.3 |
| 2004/0170288 A1* | 9/2004 | Maeda | ..................... | H04R 5/04 381/86 |
| 2006/0074645 A1* | 4/2006 | Tischer | .................. | G10K 15/02 704/226 |
| 2011/0010269 A1* | 1/2011 | Ballard | .................. | B60Q 5/008 705/26.41 |
| 2013/0216054 A1* | 8/2013 | Inoue | ....................... | H03G 3/00 381/61 |
| 2017/0096101 A1* | 4/2017 | Bailey, III | ............... | B60Q 9/00 |

OTHER PUBLICATIONS

LC Media, "2016 Ford Focus RS: It's Good to Feel Young Again", Dec. 14, 2016, published on www.sootoday.com.*
Heitbrink and Cable, Design of a Driving Simulation Sound Engine, Sep. 2007, DSC 2007 North America—Iowa City.*

* cited by examiner

*Primary Examiner* — Sonia Gay
(74) *Attorney, Agent, or Firm* — Brian M. Dingman; Dingman IP Law, PC

(57) ABSTRACT

A method for modifying sound in a motor vehicle that has an audio system. The audio system has at least one electro-acoustic transducer that creates sound from audio signals. An initial audio signal that represents a particular vehicle sound is provided, where the initial audio signal has a plurality of signal properties. A modified audio signal is then provided to the audio system, based on at least one current motor vehicle operating condition. The modified audio signal includes at least one modified signal property that differs from that of the initial audio signal. The at least one signal property is modified by a modification process that relates to a vehicle operating condition.

22 Claims, 3 Drawing Sheets

MOTOR VEHICLE SOUND ENHANCEMENT

BACKGROUND

This disclosure relates to enhancing sound in a motor vehicle.

Some motor vehicle manufacturers desire to create sounds that mimic the after-fire sounds that are prevalent in higher-end sports cars. An after-fire sound is generally understood to spring from fuel ignition in the exhaust system. Created after-fire sounds should mimic actual after-fire sounds.

SUMMARY

All examples and features mentioned below can be combined in any technically possible way.

In one aspect, a method for modifying sound in a motor vehicle that has an audio system comprising at least one electro-acoustic transducer that creates sound from audio signals, includes providing an initial audio signal that represents a particular vehicle sound, where the initial audio signal comprises a plurality of signal properties, and providing to the audio system, based on at least one current motor vehicle operating condition, a modified audio signal, wherein the modified audio signal comprises at least one modified signal property that differs from that of the initial audio signal, and wherein the at least one signal property is modified by a modification process that relates to a vehicle operating condition. In one non-limiting example, the initial audio signal represents an after-fire sound. In one non-limiting example, the current vehicle operating conditions may include engine revolutions per minute (RPM), engine load, gear position, and vehicle speed. In one non-limiting example, the modification process is a random process.

Embodiments may include one of the following features, or any combination thereof. The initial audio signal may comprise a plurality of separate sound portions separated by dead times between them, and the initial audio signal properties may comprise at least one of a level of the particular vehicle sound, a quantity of separate sound portions that make up the particular vehicle sound, a dead time between separate sound portions that make up the particular vehicle sound, a duration of one or more of the separate sound portions that make up the particular vehicle sound, a pitch of one or more of the separate sound portions that make up the particular vehicle sound, and a delay time between a trigger and the start of a first sound portion of the separate sound portions that make up the particular vehicle sound. The level, the pitch, the duration, and the dead time, may be variable as to each of the separate sound portions, and the delay time and quantity of separate sound portions that make up the particular vehicle sound may be variable as to the audio signal, but not variable as to each of the separate sound portions.

Embodiments may include one of the following features, or any combination thereof. The initial audio signal may comprise a base signal and a signal envelope. The base signal may comprise time-series audio data. The random modification process may result in the modification of the at least one signal property within a predetermined range of modifications. The modified audio signal may comprise a combination of multiple audio signals, wherein a contribution to the combination of each of the multiple audio signals is determined by a random modification process. The initial audio signal may comprise a combination of multiple audio signals, wherein a contribution to the combination of each of the multiple audio signals is determined by a random modification process.

Embodiments may include one of the following features, or any combination thereof. The random modification process may result in the modification of the at least one signal property based on a current value of a variable vehicle operating condition. The modification process may comprise using the current value of a variable vehicle operating condition to extract information from a lookup table. The lookup table may comprise a plurality of different amounts of change to the at least one signal property.

Embodiments may include one of the following features, or any combination thereof. The modified audio signal may be provided to at least one electro-acoustic transducer after a trigger event. The trigger event may be based on at least one of current and previous vehicle operating conditions. The modified audio signal may be provided to at least one electro-acoustic transducer after the trigger event followed by a delay time. The delay time may be variable.

In another aspect, a method for modifying sound in a motor vehicle that has an audio system comprising at least one electro-acoustic transducer that creates sound from audio signals, includes providing an initial audio signal that represents a vehicle after-fire sound, where the initial audio signal comprises a plurality of signal properties. The initial audio signal comprises a plurality of separate sound portions separated by dead times between them. The initial audio signal properties comprise at least one of a level of the particular vehicle sound, a quantity of separate sound portions that make up the particular vehicle sound, a dead time between separate sound portions that make up the particular vehicle sound, a duration of one or more of the separate sound portions that make up the particular vehicle sound, a pitch of one or more of the separate sound portions that make up the particular vehicle sound, and a delay time between a trigger and the start of a first sound portion of the separate sound portions that make up the particular vehicle sound. A modified audio signal is provided to the audio system, based on at least one current motor vehicle operating condition. The modified audio signal comprises at least one modified signal property that differs from that of the initial audio signal. The at least one signal property is modified by a random modification process.

Embodiments may include one of the following features, or any combination thereof. The level, the pitch, the duration, and the dead time may be variable as to each of the separate sound portions, and the delay time and quantity of separate sound portions that make up the particular vehicle sound may be variable as to the audio signal, but not variable as to each of the separate sound portions. The random modification process may comprise using the current value of a variable vehicle operating condition to extract information from a lookup table.

In another aspect, a method for modifying sound in a motor vehicle that has an audio system comprising at least one electro-acoustic transducer that creates sound from audio signals, includes providing an initial audio signal that represents a vehicle after-fire sound. The initial audio signal comprises a plurality of signal properties. The initial audio signal comprises a plurality of separate sound portions separated by dead times between them. The initial audio signal properties comprise at least one of a level of the particular vehicle sound, a quantity of separate sound portions that make up the particular vehicle sound, a dead time between separate sound portions that make up the particular vehicle sound, a duration of one or more of the separate sound portions that make up the particular vehicle sound, a pitch of one or more of the separate sound portions that make up the particular vehicle sound, and a delay time between a trigger and the start of a first sound portion of the separate sound portions that make up the particular vehicle sound. The level, the pitch, the duration, and the dead time are variable as to each of the separate sound portions, and the delay time and quantity of separate sound portions that make up the particular vehicle sound are variable as to the audio signal, but not variable as to each of the separate sound portions. A modified audio signal is provided to at least one electro-acoustic transducer of the audio system, based on at least one current motor vehicle operating condition. The modified audio signal comprises at least one modified signal property that differs from that of the initial audio signal. The signal property is modified by a modification process that comprises using the current value of a variable vehicle operating condition to extract information from a lookup table. The lookup table comprises a plurality of different amounts of change to the at least one signal property. The modification process results in the modification of the signal property within a predetermined range of modifications. The modified audio signal is provided to the electro-acoustic transducer(s) after a trigger event. The trigger event is based on at least one of current and previous vehicle operating conditions.

Embodiments may include one of the following features, or any combination thereof. The modified audio signal may comprise a combination of multiple audio signals, wherein a contribution to the combination of each of the multiple audio signals is determined by the random modification process. The modified audio signal may be provided to the electro-acoustic transducer(s) after the trigger event followed by a variable delay time.

DETAILED DESCRIPTION

Figure 1:
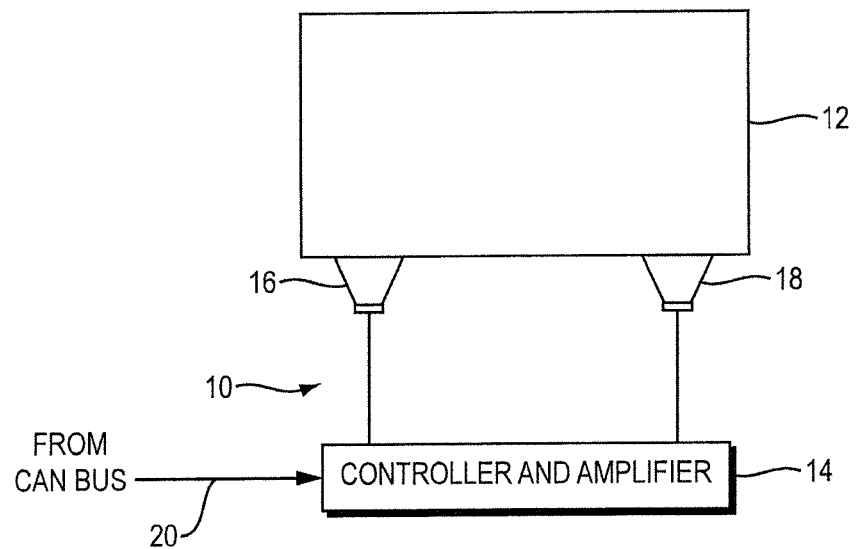
FIG. 1 is schematic diagram of a motor vehicle sound enhancement system.

The present motor vehicle sound enhancement is capable of creating sounds that closely mimic actual after-fire sounds. This can be accomplished, at least in part, by creating each after-fire sound from a base sound that is modified by a modification process. The modification process is preferably designed such that the resulting after-fire sound is, at least in some manner, different than other after-fire sounds. A result is that the driver or passenger is less likely to detect any patterns in the sounds, and so is more likely to believe that the sounds are actual after-fire sounds. Such a different result can be accomplished in a desired fashion. In one non-limiting example, an irregular result is accomplished with what is termed herein a "random" modification process. A random modification process is a process that is based, at least in part, on one (or more) numbers that are generated by a random or pseudorandom process. A random modification process is able to create a large variety of after-fire sounds from a small number of base sounds. There is thus less chance of creating repetitive sounds that a driver or passenger may realize are not actual after-fire sounds. In another non-limiting example, an irregular result is accomplished with a modification process that is based on one or more current vehicle operating conditions.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

FIG. 1 is a schematic block diagram of motor vehicle sound enhancement system 10. System 10 comprises a controller and amplifier sub-system 14, and electro-acoustic transducers (speakers) 16 and 18 that are constructed and arranged to create sound in motor vehicle cabin 12. System 10 can include one, or more than one, speaker. Sub-system 14 receives information relating to vehicle operating conditions as indicated by input 20. In the present non-limiting example, this information is available on a vehicle CAN bus. Those skilled in the art will recognize that there are other manners by which one or more motor vehicle operating conditions can be accessed by system 10, any and all of which are within the scope of the present disclosure.

System 10 is adapted to create particular vehicle-related sounds. The sounds can be created from audio signals that are provided to the speakers. System 10 can create various types of vehicle-related sounds, including, but not limited to, "after-fire" sounds that are meant to mimic actual after-fire sounds, engine harmonic enhancement (EHE) sounds that are meant to enhance the sounds made by the engine and the exhaust system (such as disclosed in U.S. Pat. No. 9,299,337, the disclosure of which is incorporated herein by reference, in its entirety), and sounds associated with gear shifts.

Actual after-fire sounds may arise under particular vehicle operating conditions, which may include but are not limited to up-shift, down-shift, and sudden change in engine load and/or fuel-air ratio (which may be caused by pressing down then rapidly lifting the foot from the motor vehicle's accelerator pedal). Sub-system 14 is adapted to generate audio signals that are sent to transducers 16 and 18. These audio signals can be created from one or more initial audio signals that represent a particular vehicle sound (such as an after-fire "pop" sound, or an engine harmonic sound). The initial audio signals can be stored in memory of sub-system 14.

In system 10, the audio signals provided to transducers 16 and 18 are modified forms of the initial audio signals. In one non-limiting example, the modifications that are made to the initial audio signals can be based on one or more current vehicle operating conditions received over input 20. One non-limiting manner of making such modifications concerns modifying one or more properties of the initial audio signal and/or the sounds produced using the audio signal. The modified properties may include properties such as the level (or, gain) of the signal, the duration of the sound, the pitch of the sound, and a delay time between when a sound is triggered and when sound creation in the motor vehicle cabin begins.

In some non-limiting cases, the sound created in the cabin includes two or more separate sound portions. For example, an after-fire sound may consist of multiple separate "pop" sounds that quickly follow one another. In cases where the audio signal can include a number of separate sound portions, the separate sound portions may be separated by dead times (i.e., quiet times) between them. The separate sound portions may each also have a duration and a pitch. Any one or more of: the quantity of separate sound portions that make up a particular vehicle sound, the dead time(s) between the separate sound portions that make up the particular vehicle sound, the duration(s) of the separate sound portions that make up a particular vehicle sound, and the pitch(es) of the separate sound portions that make up a particular vehicle sound, may be a property of the initial audio signal that can be modified based on one or more current vehicle operating conditions, in the creation of the modified audio signal.

Figure 2:
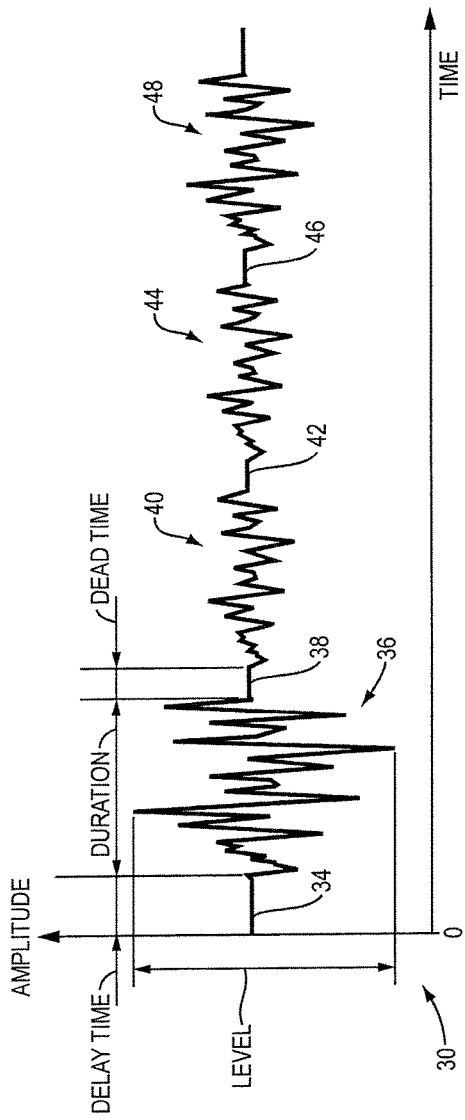
FIG. 2 is an audio signal amplitude v. time graph that illustrates an after-fire sound.

An example of an after-fire sound, in which properties set-forth above are illustrated, is depicted in FIG. 2. After-fire sound 30 comprises four separate sound portions 36, 40, 44, and 48, separated by dead times 38, 42, and 46. Delay time 34 is the dead time between the after-fire event trigger (which by definition occurs at time 0) and the beginning of first sound portion 36. Sound portion 36 has a duration, as do each of the other sound portions. Also illustrated is the level (i.e., the amplitude) of sound portion 36. Each sound portion also has a pitch; the pitch is a perceptual property of sound related to frequency, and is well understood by those of ordinary skill in the art. It should be noted that the after-fire sound illustrated in FIG. 2 is but one of myriad possibilities of after-fire sounds that can be created in accordance with the present motor-vehicle sound enhancement. An after-fire sound can have one, or more than one, "pop" sound, such as sound portion 36.

Figure 3A:
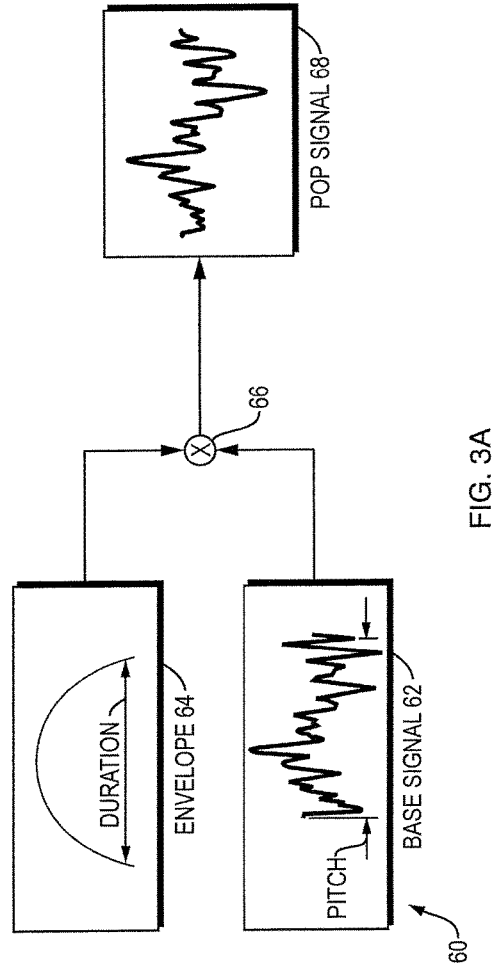
FIGS. 3A and 3B schematically illustrate two manners in which after-fire sounds can be created.

An initial audio signal that can be used to create an after-fire sound can be stored in memory of sub-system 14, using any no-known or later-developed means. Examples include storage as either time-series data of a base signal and a signal envelope, or perhaps storage as spectrum data. A non-limiting example is illustrated in FIG. 3A, where base signal 62, which can be adjusted for pitch control, and envelope 64, which can be adjusted for duration control, are shown. In one non-limiting example, the envelope can be a quasi-envelope based on the peaks of an envelope calculated based on the absolutes of a Hilbert transformation of a target/desired pop sound signal, which could be obtained from a pop sound of an actual after-fire recording. The envelope and the base signal can be multiplied together 66, to create the audio signal 68 that is played as the after-fire sound (or, more likely, is used to create each of the one or more sound portions or "pops" that make up an after-fire sound). The duration of signal 68 can be controlled by changing the duration of the envelope. The pitch of signal 68 can also be controlled, for example by adjusting the index increment for time-series sample lookup from the table memory.

Figure 3B:
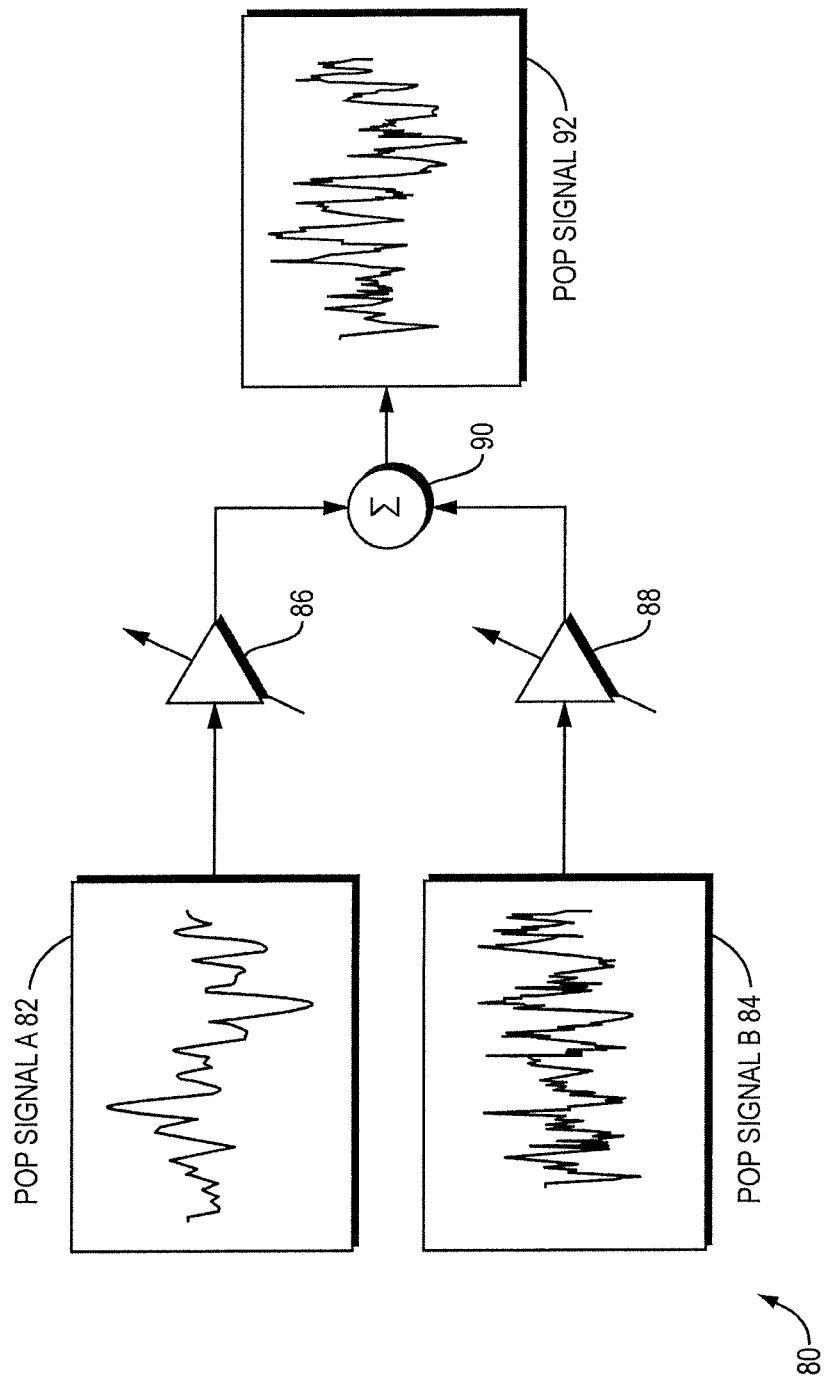

An alternative manner of creating a pop sound that can be used as the initial audio signal that is modified to create each separate sound portion of an after-fire sound, is depicted in FIG. 3B. Two sets of base signals and envelopes such as shown in FIG. 3A can be stored in memory, one set represented by pop signal A, 82, and the other represented by pop signal B, 84. The two are mixed to create pop sound 92. The mixing can be accomplished with a variable ratio of the contributions of signals A and B, as represented by variable amplifiers 86 and 88, and summation 90. In one non-limiting example, the variable ratio can be determined using a modification process, such as those described elsewhere in this document, including but not limited to a modification based on the current state of one or more vehicle operating conditions, where the modification may (or may not) be random. Random variation of the mixing of two pop sounds to create a new pop sound that can be used as the basis for the sound(s) that make up an after-fire sound, interjects more variation into the after-fire sound, which makes it sound more natural.

In one non-limiting example, any one or more of after-fire sounds that are played by system 10 can be created as follows. The properties of the audio signals that are modified include: the quantity of separate sound portions that make up the after-fire sound, the level of each of the separate sound portions that make up the after-fire sound, the dead time between the separate sound portions that make up the after-fire sound, the delay time between the trigger signal and the start of the initial sound portion, the duration of each of the separate sound portions that make up the after-fire sound, the pitch of each of the separate sound portions that make up the after-fire sound, and the ratio of the contributions of the two different pop sounds to the modified sound. Any one or more of these properties can be modified using a random modification process, such as those described herein.

One manner of accomplishing a random modification process of the initial audio signal, is as follows. A current value of a variable vehicle operating condition (which can be taken from the signals received from the vehicle CAN bus), can be used to extract information from memory, for example from a look-up table (LUT). Alternatively, the current value of other non-vehicle operating condition-based variables can be used, such as the current time (e.g., in seconds). Each LUT can include a number of possible values for one property of the audio signal, such as those described above. The possible values in the LUT can be but need not be constrained, as desired. Typically, the variation in any particular property will be constrained such that the resulting audio signal, when played, sounds like a pop of an after-fire sound. As one simple example, a gain (the level) applied to the base audio signal can be constrained to vary between −2 and +2 times the level of the initial (un-modified) audio signal, which is sometimes termed herein the "base" signal. A lookup table may have ten entries, 0 through 9. Each of the ten entries is assigned a value for the particular audio signal property; in this example, each of the ten entries is assigned a value of −2, −1, 0, +1, or +2. A current value of a variable vehicle operating condition, preferably one that is not controlled or influenced by the present sound enhancement process so that the result is considered random, or perhaps pseudorandom (e.g., the engine RPM) can be interpreted in a way that allows it to be used as a randomly generated number from 0-9. For example, RPM is usually tracked with four or five digits, the last digit being the singles value of the RPM. The last digit, of course, will always be between 0 and 9, and so can be used as the random number. This random number is used to address the appropriate LUT. The addressed value from the LUT is then used to modify the appropriate property of the base signal, to create the modified audio signal that is used in the after-fire sound. Typically, for each modified property, there is a LUT that is addressed and used in this manner. There are many other ways to generate a random or pseudorandom number using a computer algorithm which may also be used herein.

One specific, illustrative, non-limiting example of modification of several properties of a base signal, to create an after-fire sound, is as follows. This particular example is used to create an after-fire sound upon an up-shift. An after-fire sound is not created at each up-shift. Rather, an after-fire sound will be created after each instance of a "trigger" event. A trigger event is created based on certain pre-defined conditions, typically based on the current state of certain vehicle operating parameters. Trigger events are further described below. In this example (an up-shift), the quantity of separate sound portions that will make up the after-fire sound is obtained based on the change in RPM over the shift change, and the random number; in this case, then, there are two LUTs and two numbers from these LUTs are added together to make up this quantity. The gain of the sound portions is obtained based on the engine load, the vehicle speed, the gear position, and the random number. The dead time, the delay time, the duration factor, the pitch factor, and the mix ratio are each obtained based on the random number. Similar audio signal property modifications schemes can be developed for other circumstances where it is desired to create an after-fire sound.

The trigger event for each circumstance where it is desired to create an after-fire sound can be determined in a desired manner. Typically, at a high-level, this determination is based on the current state of one or more operating parameters of the motor vehicle, received from the CAN bus. Alternatively, this determination can be based on a previous state of a vehicle operating parameter, such as by calculating the rate of change of a vehicle operating parameter and comparing it to a threshold value. An illustrative, non-limiting example is as follows: for an up-shift, there is an up-shift trigger ready state that is entered whenever the target gear is greater than the current gear. An after-fire sound is then triggered when the change in RPM over the gear shift change is below a predefined threshold value. Similar trigger event creation schemes can be developed for other circumstances where it is desired to create an after-fire sound (such as down-shift and acceleration off).

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. A method for modifying sound in a motor vehicle that has an audio system comprising at least one electro-acoustic transducer that creates sound from audio signals, the method comprising:
providing an initial audio signal that represents a particular vehicle sound, where the initial audio signal comprises a plurality of signal properties, wherein the initial audio signal comprises a plurality of separate sound portions separated by dead times between them, and wherein the initial audio signal properties comprise at least one of:
a level of the particular vehicle sound;
a quantity of separate sound portions that make up the particular vehicle sound;
a dead time between separate sound portions that make up the particular vehicle sound;
a duration of one or more of the separate sound portions that make up the particular vehicle sound;
a pitch of one or more of the separate sound portions that make up the particular vehicle sound; and
a delay time between a trigger and the start of a first sound portion of the separate sound portions that make up the particular vehicle sound;
wherein the level, the pitch, the duration, and the dead time are variable as to each of the separate sound portions, and wherein the delay time and quantity of separate sound portions that make up the particular vehicle sound are variable as to the audio signal, but not variable as to each of the separate sound portions; and
providing to the audio system, based on at least one current motor vehicle operating condition, a modified audio signal, wherein the modified audio signal comprises at least one modified signal property that differs from that of the initial audio signal, and wherein the at least one signal property is modified by a modification process that relates to a vehicle operating condition.

2. The method of claim 1, wherein the initial audio signal represents an after-fire sound.

3. The method of claim 1, wherein the initial audio signal comprises a base signal and a signal envelope.

4. The method of claim 3, wherein the base signal comprises time-series audio data.

5. The method of claim 1, wherein the modification process results in the modification of the at least one signal property based on a current value of a variable vehicle operating condition.

6. The method of claim 5, wherein the modification process comprises using the current value of a variable vehicle operating condition to extract information from a lookup table.

7. The method of claim 6, wherein the lookup table comprises a plurality of different amounts of change to the at least one signal property.

8. The method of claim 1, wherein the modification process results in the modification of the at least one signal property within a predetermined range of modifications.

9. The method of claim 1, wherein the modified audio signal comprises a combination of multiple audio signals, wherein a contribution to the combination of each of the multiple audio signals is determined by the modification process.

10. The method of claim 1, wherein the modified audio signal is provided to at least one electro-acoustic transducer after a trigger event.

11. The method of claim 10, wherein the trigger event is based on at least one of current and previous vehicle operating conditions.

12. The method of claim 10, wherein the modified audio signal is provided to at least one electro-acoustic transducer after the trigger event followed by a delay time.

13. The method of claim 12, wherein the delay time is variable.

14. The method of claim 1, wherein the current vehicle operating conditions comprise engine revolutions per minute (RPM), engine load, gear position, and vehicle speed.

15. The method of claim 1, wherein the initial audio signal further comprises a combination of multiple audio signals, wherein a contribution to the combination of each of the multiple audio signals is determined by a modification process that relates to a vehicle operating condition.

16. The method of claim 1, wherein the modification process comprises a random modification process.

17. A method for modifying sound in a motor vehicle that has an audio system comprising at least one electro-acoustic transducer that creates sound from audio signals, the method comprising: providing an initial audio signal that represents a vehicle after-fire sound, where the initial audio signal comprises a plurality of signal properties, wherein the initial audio signal comprises a plurality of separate sound portions separated by dead times between them, and wherein the initial audio signal properties comprise at least one of: a level of the particular vehicle sound; a quantity of separate sound portions that make up the particular vehicle sound; a dead time between separate sound portions that make up the particular vehicle sound; a duration of one or more of the separate sound portions that make up the particular vehicle sound; a pitch of one or more of the separate sound portions that make up the particular vehicle sound; and a delay time between a trigger and the start of a first sound portion of the separate sound portions that make up the particular vehicle sound; wherein the level, the pitch, the duration, and the dead time are variable as to each of the separate sound portions, and wherein the delay time and quantity of separate sound portions that make up the particular vehicle sound are variable as to the audio signal, but not variable as to each of the separate sound portions; and providing to the audio system, based on at least one current motor vehicle operating condition, a modified audio signal, wherein the modified audio signal comprises at least one modified signal property that differs from that of the initial audio signal, and wherein the at least one signal property is modified by a random modification process.

18. The method of claim 17, wherein the level, the pitch, the duration, and the dead time are variable as to each of the separate sound portions, and wherein the delay time and quantity of separate sound portions that make up the particular vehicle sound are variable as to the audio signal but not variable as to each of the separate sound portions.

19. The method of claim 18, wherein the random modification process comprises using the current value of a variable vehicle operating condition to extract information from a lookup table.

20. A method for modifying sound in a motor vehicle that has an audio system comprising at least one electro-acoustic transducer that creates sound from audio signals, the method comprising:
providing an initial audio signal that represents a vehicle after-fire sound, where the initial audio signal comprises a plurality of signal properties, wherein the initial audio signal comprises a plurality of separate sound portions separated by dead times between them, and wherein the initial audio signal properties comprise at least one of:
a level of the particular vehicle sound;
a quantity of separate sound portions that make up the particular vehicle sound;
a dead time between separate sound portions that make up the particular vehicle sound;
a duration of one or more of the separate sound portions that make up the particular vehicle sound;
a pitch of one or more of the separate sound portions that make up the particular vehicle sound; and
a delay time between a trigger and the start of a first sound portion of the separate sound portions that make up the particular vehicle sound
wherein the level, the pitch, the duration, and the dead time are variable as to each of the separate sound portions, and wherein the delay time and quantity of separate sound portions that make up the particular vehicle sound are variable as to the audio signal, but not variable as to each of the separate sound portions; and
providing to at least one electro-acoustic transducer of the audio system, based on at least one current motor vehicle operating condition, a modified audio signal, wherein the modified audio signal comprises at least one modified signal property that differs from that of the initial audio signal, and wherein the at least one signal property is modified by a modification process that comprises using the current value of a variable vehicle operating condition to extract information from a lookup table, wherein the lookup table comprises a plurality of different amounts of change to the at least one signal property, and the modification process results in the modification of the at least one signal property within a predetermined range of modifications;
wherein the modified audio signal is provided to the at least one electro-acoustic transducer after a trigger event, wherein the trigger event is based on at least one of current and previous vehicle operating conditions.

21. The method of claim 20, wherein the modified audio signal comprises a combination of multiple audio signals, wherein a contribution to the combination of each of the multiple audio signals is determined by a random modification process.

22. The method of claim 21, wherein the modified audio signal is provided to at least one electro-acoustic transducer after the trigger event followed by a variable delay time.

* * * * *